(12) United States Patent  
Nishikawa et al.

(10) Patent No.: US 7,545,095 B2  
(45) Date of Patent: Jun. 9, 2009

(54) ELECTROLUMINESCENT DISPLAY DEVICE

(75) Inventors: Ryuji Nishikawa, Gifu (JP); Kazuyuki Maeda, Nishikasugai-gun (JP)

(73) Assignee: SANYO Electric Co., Ltd., Osaka (JP)

( * ) Notice: Subject to any disclaimer, the term of this patent is extended or adjusted under 35 U.S.C. 154(b) by 1111 days.

(21) Appl. No.: 10/758,596

(22) Filed: Jan. 16, 2004

(65) Prior Publication Data

US 2004/0207321 A1   Oct. 21, 2004

(51) Int. Cl.
*H01J 63/04* (2006.01)

(52) U.S. Cl. ...................................... 313/506

(58) Field of Classification Search ......... 313/504–506; 349/109–110
See application file for complete search history.

(56) References Cited

U.S. PATENT DOCUMENTS

| 5,783,484 | A | 7/1998 | Jun |
| 5,870,157 | A | 2/1999 | Shimada et al. |
| 5,900,072 | A | 5/1999 | Jun |
| 6,271,902 | B1 * | 8/2001 | Ogura et al. ................. 349/106 |
| 6,309,486 | B1 * | 10/2001 | Kawaguchi et al. ............ 156/67 |
| 6,326,936 | B1 * | 12/2001 | Inganas et al. ................. 345/55 |
| 6,392,340 | B2 | 5/2002 | Yoneda et al. |
| 6,963,168 | B2 | 11/2005 | Eida et al. |

2001/0050532 A1 * 12/2001 Eida et al. ................... 313/504

FOREIGN PATENT DOCUMENTS

| JP | 08-327815 | 12/1996 |
| JP | 9-152593 | 6/1997 |
| JP | 9-153488 | 6/1997 |
| JP | 11-026156 | 1/1999 |
| JP | 11-212076 | 8/1999 |
| JP | 11-251059 | 9/1999 |
| JP | 2002-015861 | 1/2002 |
| JP | 2002-134268 | 5/2002 |
| JP | 2003-017263 | 1/2003 |
| KR | 1997-0018197 | 4/1997 |
| KR | 2002-0044565 | 6/2002 |
| WO | WO-02/17689 | 2/2002 |

* cited by examiner

*Primary Examiner*—Toan Ton
*Assistant Examiner*—Hana A Sanei
(74) *Attorney, Agent, or Firm*—Morrison & Foerster LLP

(57) ABSTRACT

The invention is directed to an electroluminescent display device in which a first planarization insulating film need not be used so that a manufacturing cost reduces, and a display defect caused by a cut in an organic EL layer or moisture absorption at a step portion is prevented. An R color filter layer, a G color filter layer, and a B color filter layer are so formed that end portions of the adjacent R, G, and B color filter layers overlap each other. The R color filter layer, the G color filter layer, and the B color filter layer serve as a first planarization insulating film. For planarization, the end portions of the color filter layers overlap each other. For reducing a step height of an overlapping portion, the end portions of the color filters are formed in a tapered shape.

8 Claims, 5 Drawing Sheets

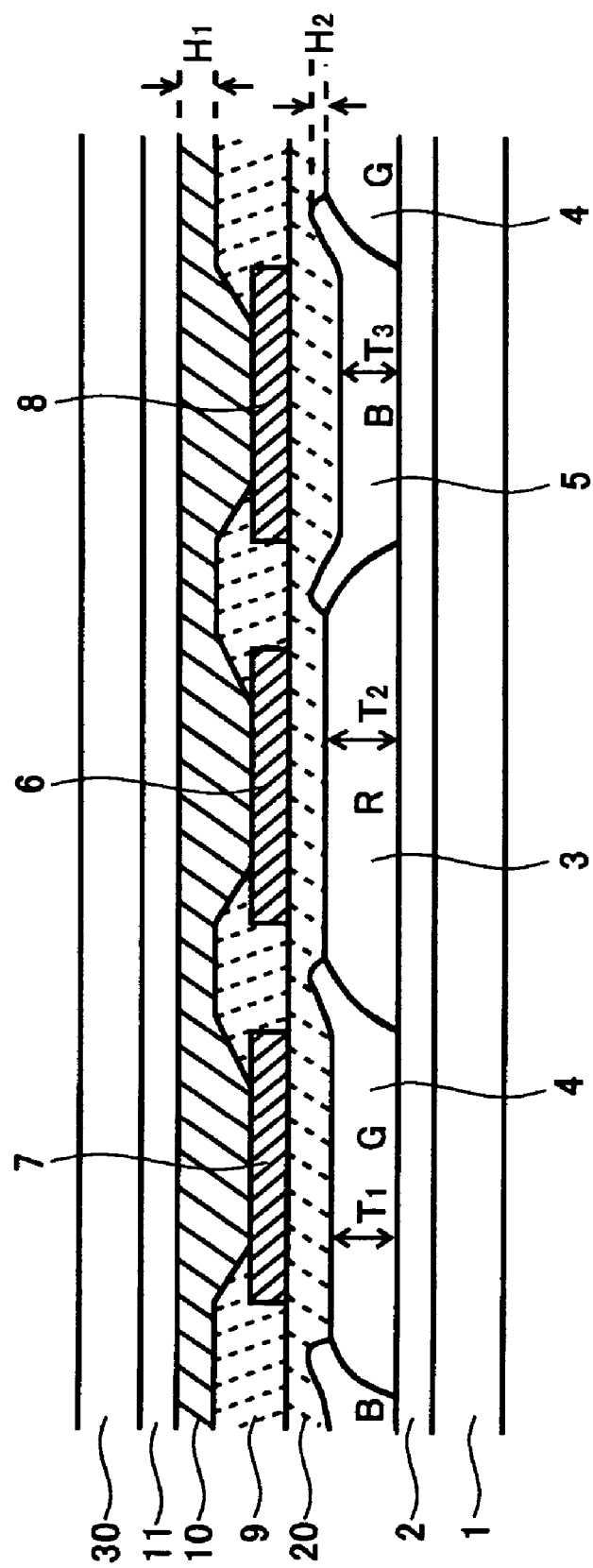

ELECTROLUMINESCENT DISPLAY DEVICE

BACKGROUND OF THE INVENTION

1. Field of the Invention

The invention relates to an electroluminescent display device, particularly to an electroluminescent display device having color filter layers.

2. Description of the Related Art

An organic electroluminescent (hereafter, referred to as EL) element is a self-emission element. An organic EL display device using the organic EL element is receiving an attention as a new display device substituted for a CRT or an LCD.

FIG. 5 is a schematic cross-sectional view showing a pixel of a full-color organic EL display device of the conventional art. A numeral 200 designates a glass substrate, a numeral 201 designates an organic EL element driving TFT (thin film transistor) formed on the glass substrate 200, and a numeral 202 designates a first planarization insulating film. A numeral 203 designates an anode layer made of ITO (indium tin oxide) which is connected with the TFT 201 and extends over the first planarization insulating film 202, and a numeral 204 designates a second planarization insulating film formed so as to cover an end portion of the anode layer 203. A numeral 205 designates R (red), G (green), and B (blue) organic EL layers formed on the anode layer 203, and a numeral 206 designates a cathode layer formed on the organic EL layer 205.

A glass substrate 207 covers the cathode layer 206. The glass substrate 207 and the glass substrate 200 are attached at their edges, and the R, G, and B organic EL layers 205 are enclosed therein. Here, the R, G, and B organic EL layers 205 are respectively formed by selectively performing vapor-deposition of each of R, G, and B organic EL materials by using a metal mask.

On the other hand, as a method of realizing a full-color organic EL display device without using the above R, G, and B organic EL layers 205, a method of using color filter layers has been proposed. In this case, a combination of a white organic EL layer and color filter layers is employed.

FIG. 6 is a cross-sectional view of such a full-color organic EL display device. An insulating layer 301 as a substrate is formed on the glass substrate 300, and an R color filter layer 302, a G color filter layer 303, and a B color filter layer 304 are formed on the insulating film 301. Each of these color filter layers transmit light having a predetermined wavelength corresponding to each of the R, G, and B colors, which is irradiated from the white organic EL layer. Although not shown, an organic EL element driving TFT is formed under these color filter layers 302, 303, and 304 in a manner similar to the TFT 201 of FIG. 5.

A first planarization insulating film 305 is formed on these color filter layers 302, 303, and 304. Anode layers 306, 307, and 308 are formed on the first planarization insulating film 305, corresponding to each of the R, G, and B colors. A second planarization insulating film 309 is formed so as to cover end portions of the anode layers 306, 307, and 308, and a white organic EL layer 310 and a cathode layer 311 are laminated thereon in this order. Furthermore, a glass substrate 312 covers the cathode layer 311, and the glass substrate 312 and the glass substrate 300 are attached at their edges, so that the white organic EL layer 310 is enclosed therein.

Here, the reason to provide the second planarization insulating film 309 is that the distance between the anode layers 306, 307, and 308 and the cathode layer 311 becomes small without the second planarization insulating film 309 and may cause a short circuit. The second planarization insulating film 309 is formed with openings except above the end portions of the anode layers 306, 307, and 308, and the white organic EL layer 310 is in contact with the anode layers 306, 307, and 308 exposed in the openings.

The organic EL display device of this type is described in a Japanese Patent Application Publication No. Hei 11-251059.

However, the organic EL display device employing the described structure of the white organic EL layer and the color filter layers has following problems. Firstly, since the first planarization insulating film 305 is formed on the R color filter layer 302, the G color filter layer 303, and the B color filter layer 304, a manufacturing cost increases accordingly. This can be solved by eliminating the first planarization insulating film 305 by using the color filter layers as the first planarization insulating film 305. In this case, the adjacent color filter layers need to overlap each other for planarization and for increasing an aperture ratio. However, since the step height at the overlapping portion of the color filter layers becomes large, a display defect may occur by a cut in the organic EL layer, moisture absorption at the step portion, and so on.

Secondly, as the first planarization insulating film 305, organic resin such as acrylic resin having a thickness of 2 to 3 micrometers must be used for planarization. However, since the organic resin has high moisture absorbency, it can have an adverse effect on the organic EL layer which is sensitive to moisture, causing a display defect.

SUMMARY OF THE INVENTION

The invention provides a color electroluminescent display device that includes a plurality of color pixels and a plurality of color filter layers provided for the color pixels on an insulating substrate. Each of the color filter layers allows a transmission of light of a color of a corresponding color pixel. The display device also includes an anode layer formed on each of the color filter layers, a white electroluminescent layer formed on the anode layers, and a cathode layer formed on the white electroluminescent layer. End portions of the color filter layers are tapered, and the tapered end portions of adjacent color filter layers overlap each other. A thin planarization insulating film may be formed directly on the color filter layers in addition to another planarization insulating film that covers end portions of the anode layers.

BRIEF DESCRIPTION OF THE DRAWINGS

FIG. 3 is a cross-sectional view of a modified organic EL display device of the embodiment of the invention.

DETAILED DESCRIPTION OF THE INVENTION

Figure 1:
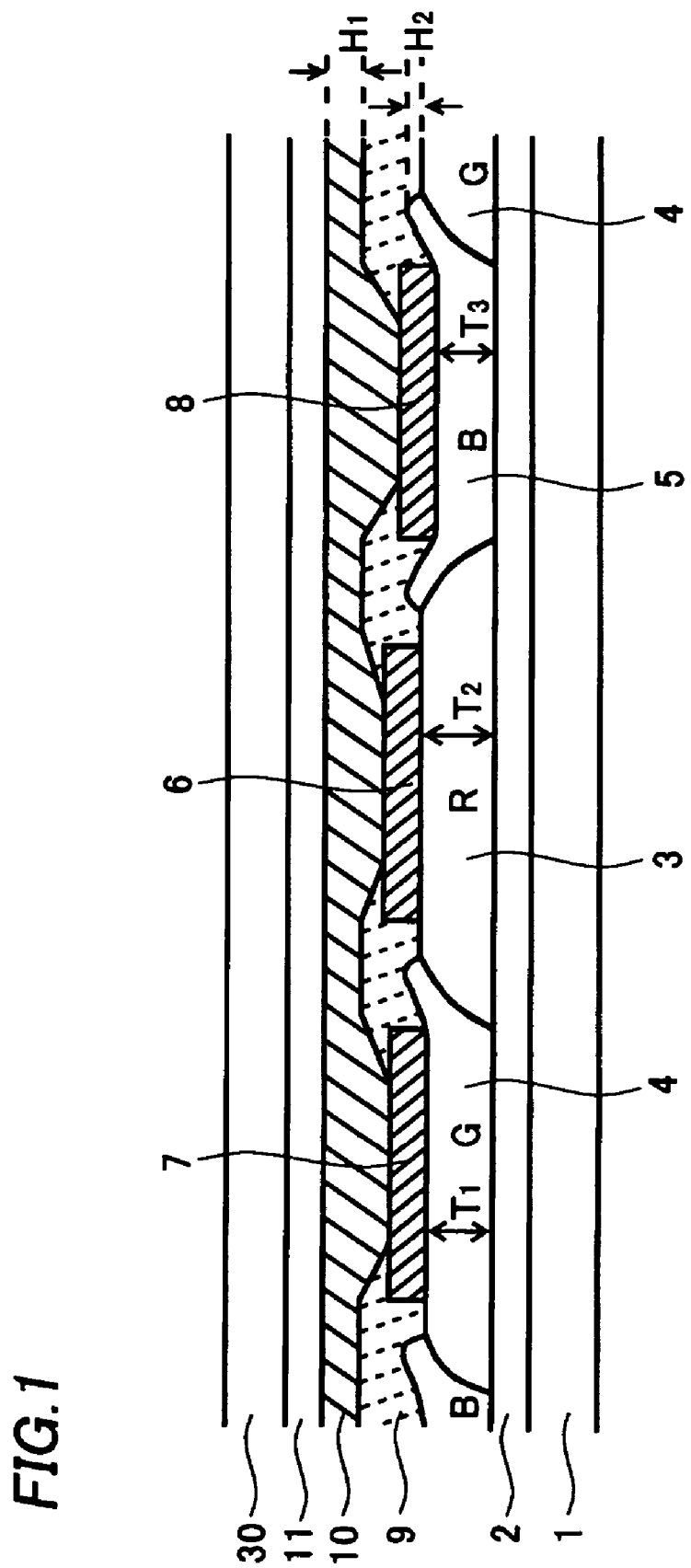
FIG. 1 is a cross-sectional view of an organic EL display device of an embodiment of the invention.

An embodiment of the invention will be described with reference to the drawings. FIG. 1 is a cross-sectional view showing a pixel of an organic EL display device of the embodiment of the invention. In an actual organic EL display device, a plurality of the pixels is arranged in a matrix.

An insulating film 2 made of $SiO_2$ as a substrate is formed on a glass substrate 1. An R color filter layer 3, a G color filter layer 4, and a B color filter layer 5 are formed adjacent each other on the insulating film 2. Each of these color filter layers transmits light having a predetermined wavelength corresponding to each of R, G, and B colors, which is irradiated from a white organic EL layer 10. Although not shown, an organic EL element driving TFT and a pixel selecting TFT are formed under these color filter layers.

Figure 5:
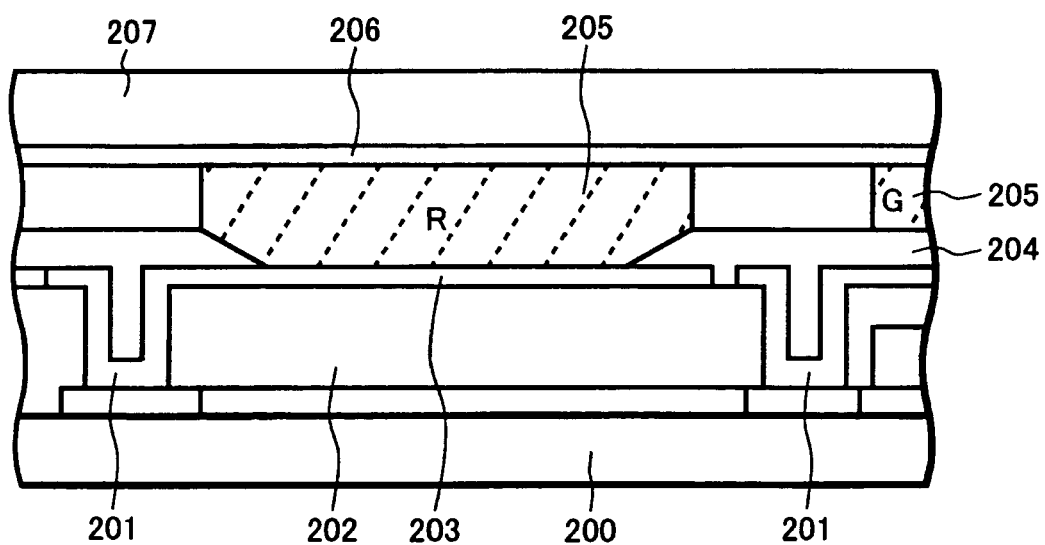
FIG. 5 is a cross-sectional view of a conventional organic EL display device.
Figure 6:
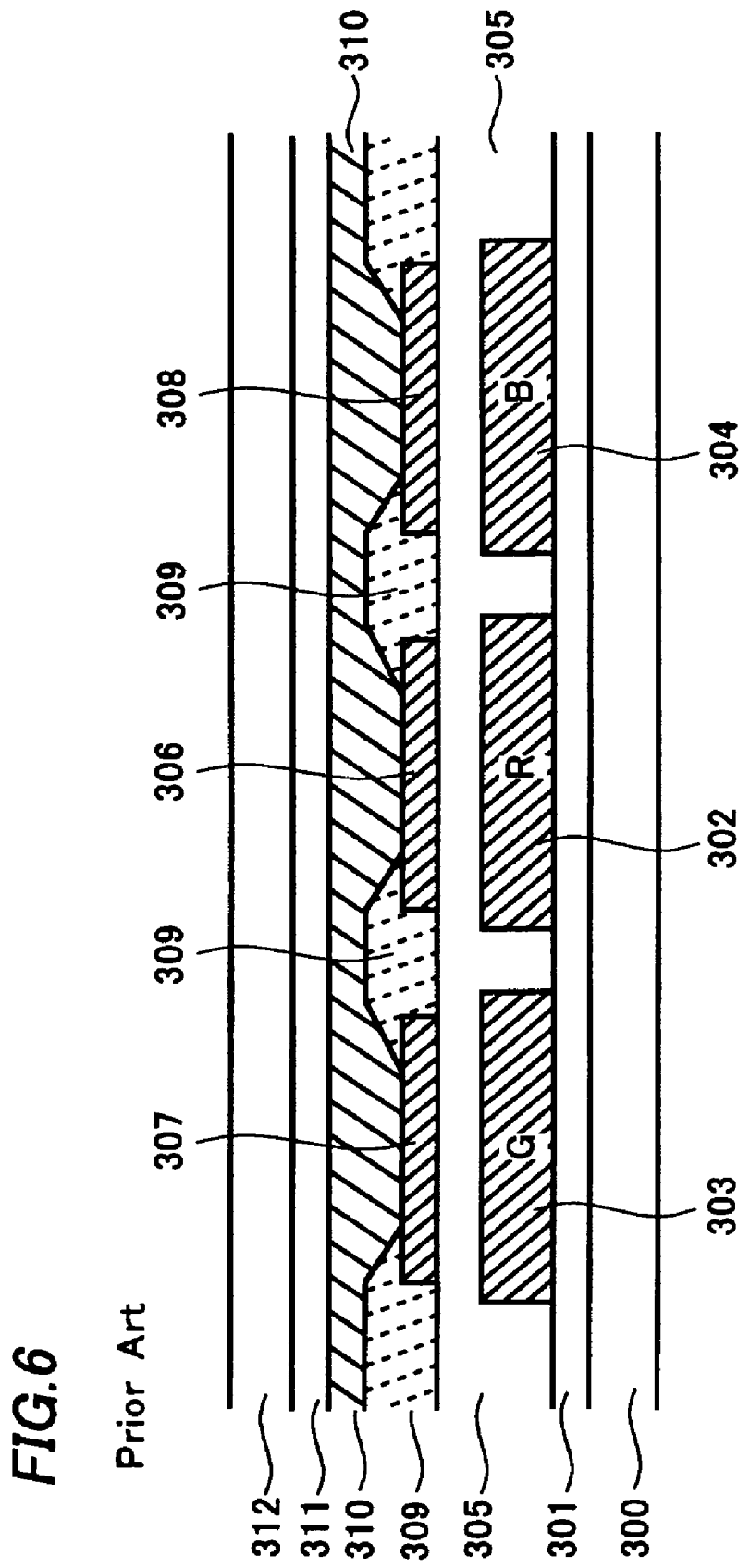
FIG. 6 is a cross-sectional view of another conventional organic EL display device.

The R color filter layer 3, the G color filter layer 4, and the B color filter layer 5 also serve as a first planarization insulating film, such as the one 202 in FIG. 5. End portions of the color filter layers are overlapped for planarization. The end portions of the color filter layers are formed in a tapered shape so as to reduce a step height H2 at an overlapping portion. For example, the both end portions of the R color filter layer 3 are formed in a tapered shape, and one of the end portions of the G color filter layer 4 is formed to cover one of the end portions of the R color filter layer 3. Furthermore, the both end portions of the B color filter layer 5 are formed to respectively cover the end portion of the R color filer layer 3 and the end portion of the G color filter layer 4.

A conventional planarization insulating film is not formed on these color filter layers, but anode layers 6, 7, and 8 are formed directly on the R color filter layer 3, the G color filter layer 4, and the B color filter layer 5, respectively. Furthermore, a second planarization insulating film 9 is formed to cover end portions of the anode layers 6, 7, and 8, and a white organic EL layer 10 and a cathode layer 11 are laminated thereon in this order. A glass substrate 30 covers the cathode layer 11, and the glass substrate 30 and the glass substrate 1 are attached at their edges to enclose the white organic EL layer 10 therein.

The reason to provide the second planarization insulating film 9 is the same as the conventional art, that is, the distance between the anode layers 6, 7, and 8 and the cathode layer 11 becomes small without the second planarization insulating film 9 so that a short circuit can occur between the anode layers 6, 7, and 8 and the cathode layer 11. Openings are formed in the second planarization insulating film 9 except above the end portions of the anode layers 6, 7, and 8. The white organic EL layer 10 is formed on the anode layers 6, 7, and 8 exposed in the openings, being in contact therewith.

Figure 2A:
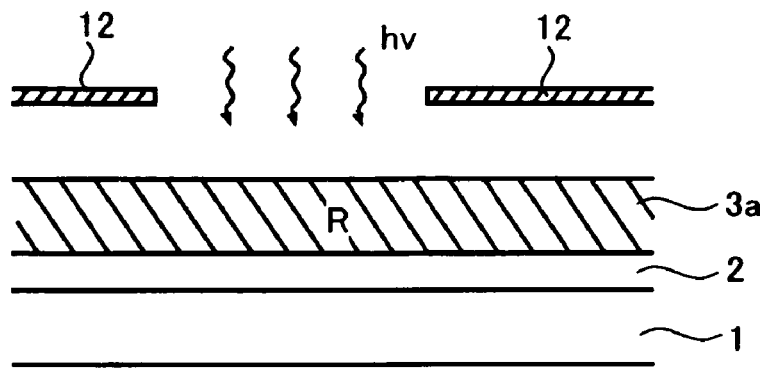
FIGS. 2A, 2B, 2C, and 2D are cross-sectional views of processing steps of color filter layers of the display device of FIG. 1.
Figure 2B:
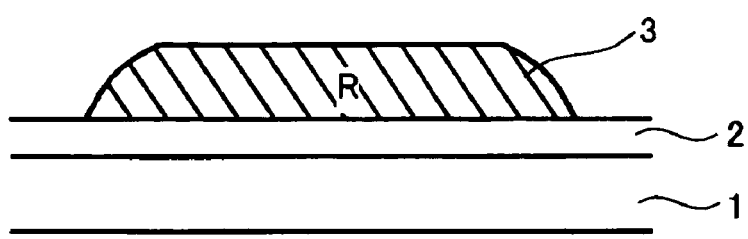

A forming method of the color filter layers will be described with reference to FIGS. 2A, 2B, 2C, and 2D. Here, a forming method of the R color filter layer 3 and the G color filter layer 4 will be described. As shown in FIG. 2A, the R color filter material layer 3a made of a negative photoresist containing a predetermined pigment is coated on the whole surface of the insulating film 2 serving as a substrate formed on the glass substrate 1. Then, the R color filter material layer 3a is exposed to light through predetermined masks 12. When the R color filter material layer 3a undergoes next development treatment, as shown in FIG. 2B, a portion of the R color filter material layer 3a which is exposed to light remains to form the R color filter layer 3. The R color filter layer 3 is formed by this exposure and development process, having tapered portions at its ends. This is because that the R color filter material layer 3a receives light beyond the area corresponding to the opening of the mask 12 with an intensity that is smaller than that of the central portion of the mask and is gradually decreasing.

Figure 2C:
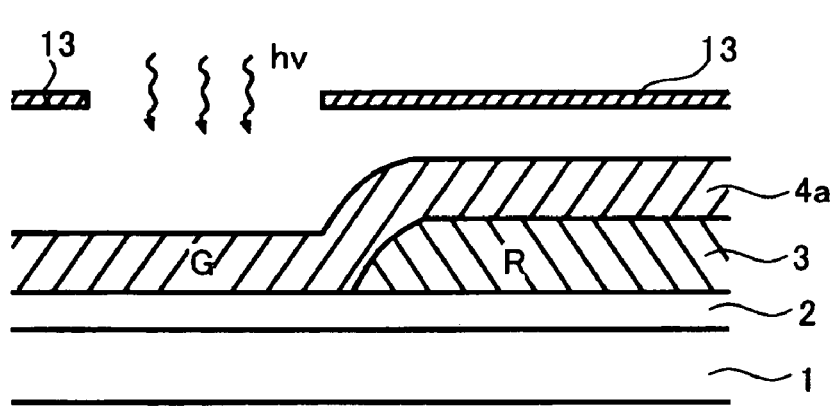
Figure 2D:
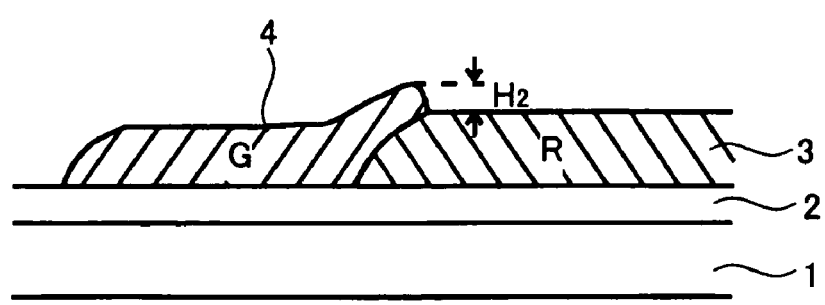

Next, as shown in FIG. 2C, a G color filter material layer 4a made of a negative photoresist containing a predetermined pigment is coated on the whole surface. The G color filter material layer 4a is exposed to light through predetermined masks 13. When the G color filter material layer 4a undergoes next development treatment, as shown in FIG. 2D, a portion of the G color filter material layer 4a which is exposed to light remains to form the G color filter layer 4. By positioning the masks 13 as shown in FIG. 2D, the end portion of the G color filter layer 4 overlaps the end portion of the R color filter layer 3.

The end portion of the R color filter layer 3 is formed in a tapered shape. The end portion of the G color filter layer 4 has a tapered shape and becomes gradually thinner toward its end. Therefore, a step height H2 of an overlapping portion of the G color filter layer 4 and the R color filter layer 3 is reduced. The forming method of the B color filter layer 5 is the same as this.

Here, the less the step height H2 of the overlapping portion of the R, G, and B color filter layers is, the better the display performs. However, for preventing a cut in the white organic EL layer 9 formed above the R, G, and B color filter layers, which can be caused by the step height H2, when a film thickness of the white organic EL layer 9 is H1, it is preferable that H1 is larger than H2. In this embodiment, both end portions of the B color filter layer 5 are formed to cover the end portions of the adjacent R color filter layer 3 and G color filter layer 4, respectively.

For minimizing the step height H2 of the overlapping portion of the color filter layers, the color filter layers are preferably formed in a decreasing order of thickness. For example, when the thicknesses of the R color filter layer 3, the G color filter layer 4, and the B color filter layer 5 are T1, T2, and T3, respectively, it is preferable that T1 is lager than T2 and T2 is larger than T3. In this case, the R color filter layer 3, the G color filter layer 4, and the B color filter layer 5 are formed in this order.

Accordingly, in this embodiment, the R color filter layer 3, the G color filter layer 4, and the B color filter layer 5 serve as the first planarization insulating film. However, as shown in FIG. 3, the first planarization insulating film 20 can be further formed on these color filter layers. This first planarization insulating film 20 can be formed thinner than the conventional art since the planarization is already realized to some extent by the R color filter layer 3, the G color filter layer 4, and the B color filter layer 5. A preferable film thickness is between 200 nm and 300 nm.

Furthermore, since the first planarization insulating film 20 is thin, the first planarization insulating film 20 can be formed of an inorganic insulating film having low absorbency by a PCVD (plasma-activated chemical vapor deposition) method. It is preferable to employ a silicon oxide film, a TEOS film, or a silicon nitride film as the inorganic insulating film.

Figure 4:
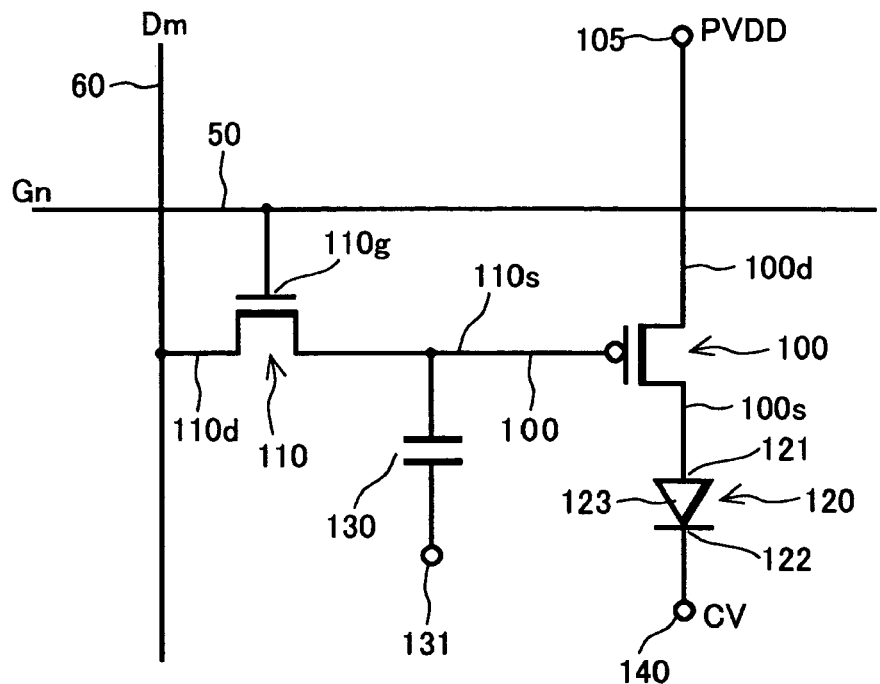
FIG. 4 is an equivalent circuit diagram of the organic EL display device of the embodiment of the invention.

Next, an equivalent circuit of the described organic EL display device and its operation will be described. FIG. 4 is an equivalent circuit diagram of the organic EL display device, showing a pixel formed in a periphery of a gate signal line 50 at an n-th row and a drain signal line 60 at an m-th column.

The gate signal line 50 for supplying a gate signal Gn and the drain signal line 60 for supplying a drain signal, that is, a video signal Dm cross each other. An organic EL element 120, a TFT 100 for driving the organic EL element 120, and a TFT 110 for selecting a pixel are formed in a periphery of an intersection of the both signal lines 50 and 60.

A drive source 105 is connected with a drain 100d of the organic EL element driving TFT 100, and supplies a positive drive voltage PVdd. A source 100s is connected with an anode 121 of the organic EL element 120.

A gate 110g of the selecting TFT 110 for selecting a pixel is connected with the gate signal line 50 and supplied with a gate signal Gn. A drain 110d is connected with the drain signal line 60 and supplied with the video signal Dm. The source 110s of the selecting TFT 110 is connected with the gate 100g of the driving TFT 100. Here, the gate signal Gn is outputted from a gate driver circuit (not shown). The video signal Dm is outputted from a drain driver circuit (not shown).

The organic EL element is made of the anode 121, a cathode 122, and an emissive layer 123 formed between the anode 121 and the cathode 122. The cathode 122 is connected with a common source 140 for supplying a negative common voltage CV.

Furthermore, the gate 100g of the driving TFT 100 is connected with a storage capacitor 130. That is, one electrode of the storage capacitor 130 is connected with the gate 100g, and another electrode thereof is connected with the storage capacitor electrode 131. The storage capacitor 130 is provided for storing the video signal of the pixel for one field period by storing electric charge corresponding to the video signal Dm.

An operation of the EL display device having the described structure will be described as follows. When the gate signal Gn becomes high level for one horizontal period, the selecting TFT 110 turns on. Then, the video signal Dm is applied from the drain signal line 60 to the gate 100g of the driving TFT 100 through the selecting TFT 110. In response to the video signal Dm supplied to the gate 100g, conductance of the driving TFT 100 changes. The drive electric current corresponding to the conductance is supplied from the drive source 105 to the organic EL element 120 through the driving TFT 100. Accordingly, luminance of the organic EL element 120 is controlled.

Although colors of the color pixels and the color filter layers are R (red), G (green), and B (blue) in this embodiment, the colors may be yellow or magenta. Furthermore, the "white EL" is mainly white, but may be reddish or bluish.

What is claimed is:

1. A color electroluminescent display device comprising:
   a plurality of color pixels;
   a plurality of color filter layers provided for the color pixels on an insulating substrate, each of the color filter layers allowing a transmission of light of a color of a corresponding color pixel;
   an anode layer formed on each of the color filter layers;
   a white electroluminescent layer formed on the anode layers; and
   a cathode layer formed on the white electroluminescent layer,
   wherein end portions of the color filter layers are tapered, the tapered end portions of adjacent color filter layers overlap each other,
   the color filter layers have different thicknesses, and end portions of thinner color filter layers are disposed on end portions of thicker color filter layers.

2. The color electroluminescent display device of claim 1, wherein a step height at an overlapping portion of the color filter layers is smaller than a thickness of the white electroluminescent layer.

3. A color electroluminescent display device having a plurality of color pixels, comprising:
   a plurality of color filter layers provided for the color pixels on an insulating substrate, each of the color filter layers allowing a transmission of light of a color of a corresponding color pixel;
   a planarization insulating film formed on the color filter layers;
   anode layers formed on the planarization insulating film;
   a white electroluminescent layer formed on the anode layers; and
   a cathode layer formed on the white electroluminescent layer,
   wherein end portions of the color filter layers are tapered, the tapered end portions of adjacent color filter layers overlap each other,
   the color filter layers have different thicknesses, and end portions of thinner color filter layers are disposed on end portions of thicker color filter layers.

4. The color electroluminescent display device of claim 3, wherein the planarization insulating film comprises an inorganic insulating film.

5. The color electroluminescent display device of claim 4, wherein the inorganic insulating film is a silicon oxide film, a TEOS film or a silicon nitride film.

6. A color electroluminescent display device having a plurality of color pixels, comprising:
   a plurality of color filter layers provided for the color pixels on an insulating substrate, each of the color filter layers allowing a transmission of light of a color of a corresponding color pixel;
   a first planarization insulating film formed on the color filter layers;
   anode layers formed on the first planarization insulating film;
   a second planarization insulating film formed so as to cover end portions of the anode layers;
   a white electroluminescent layer formed on the anode layers; and
   a cathode layer formed on the white electroluminescent layer,
   wherein end portions of the color filter layers are tapered, the tapered end portions of adjacent color filter layers overlap each other,
   the color filter layers have different thicknesses, and end portions of thinner color filter layers are disposed on end portions of thicker color filter layers.

7. The color electroluminescent display device of claim 6, wherein the first planarization insulating film comprises an inorganic insulating film.

8. The color electroluminescent display device of claim 7, wherein the inorganic insulating film is a silicon oxide film, a TEOS film or a silicon nitride film.

* * * * *

UNITED STATES PATENT AND TRADEMARK OFFICE
CERTIFICATE OF CORRECTION

| | |
|---|---|
| PATENT NO. | : 7,545,095 B2 |
| APPLICATION NO. | : 10/758596 |
| DATED | : June 9, 2009 |
| INVENTOR(S) | : Ryuji Nishikawa et al. |

Page 1 of 1

It is certified that error appears in the above-identified patent and that said Letters Patent is hereby corrected as shown below:

On the Title Page

Please insert the following:

Item --(30)    Foreign Application Priority Data

Jan. 21, 2003    JAPAN   (JP) .................................2003-012380--

Signed and Sealed this

Twenty-first Day of July, 2009

JOHN DOLL
*Acting Director of the United States Patent and Trademark Office*